United States Patent
Jakobs

(10) Patent No.: US 7,315,969 B2
(45) Date of Patent: Jan. 1, 2008

(54) MEMORY MODULE WITH A TEST DEVICE

(75) Inventor: Andreas Jakobs, München (DE)

(73) Assignee: Infineon Technologies AG, Neubiberg (DE)

( * ) Notice: Subject to any disclaimer, the term of this patent is extended or adjusted under 35 U.S.C. 154(b) by 537 days.

(21) Appl. No.: 10/737,776

(22) Filed: Dec. 18, 2003

(65) Prior Publication Data

US 2004/0145935 A1    Jul. 29, 2004

(30) Foreign Application Priority Data

Dec. 20, 2002    (DE) ................................ 10260184

(51) Int. Cl.
*G11C 29/00*    (2006.01)

(52) U.S. Cl. ....................................... 714/718

(58) Field of Classification Search ................ 714/718, 714/719, 733, 735
See application file for complete search history.

(56) References Cited

U.S. PATENT DOCUMENTS

| | | | |
|---|---|---|---|
| 5,428,624 A * | 6/1995 | Blair et al. .................. | 714/727 |
| 5,561,628 A * | 10/1996 | Terada et al. .......... | 365/185.04 |
| 6,026,007 A * | 2/2000 | Jigour et al. .................. | 365/51 |
| 6,058,056 A * | 5/2000 | Beffa et al. ................ | 365/201 |
| 6,138,255 A * | 10/2000 | Noji ............................ | 714/719 |
| 6,769,081 B1 * | 7/2004 | Parulkar ...................... | 714/733 |
| 6,928,593 B1 * | 8/2005 | Halbert et al. .............. | 714/718 |
| 2006/0239055 A1 * | 10/2006 | Sonoda et al. ................ | 365/51 |

FOREIGN PATENT DOCUMENTS

WO    WO 02/25957 A2    3/2002

OTHER PUBLICATIONS

Examination Report corresponding to DE 10260 184.4-55 (2 pages), Apr. 13, 2004.

* cited by examiner

*Primary Examiner*—James C. Kerveros
(74) *Attorney, Agent, or Firm*—Edell, Shapiro & Finnan, LLC

(57) ABSTRACT

A memory module, which enables a module-internal, cross-chip electrical functional test of a plurality of integrated memory chips arranged on a printed circuit board of the memory module, includes a test device arranged separately from the memory chips on the printed circuit board. The test device relies on a clock signal provided by an external tester and generates the test signals required for carrying out the functional test and forwards the signals via control lines, address lines, data lines, and lines for the selection of individual memory chips to the latter. The partial integration of test functions into the test device enables a greater independence with respect to external electromagnetic interference influences without the space requirement of the memory module being increased overmuch.

8 Claims, 2 Drawing Sheets

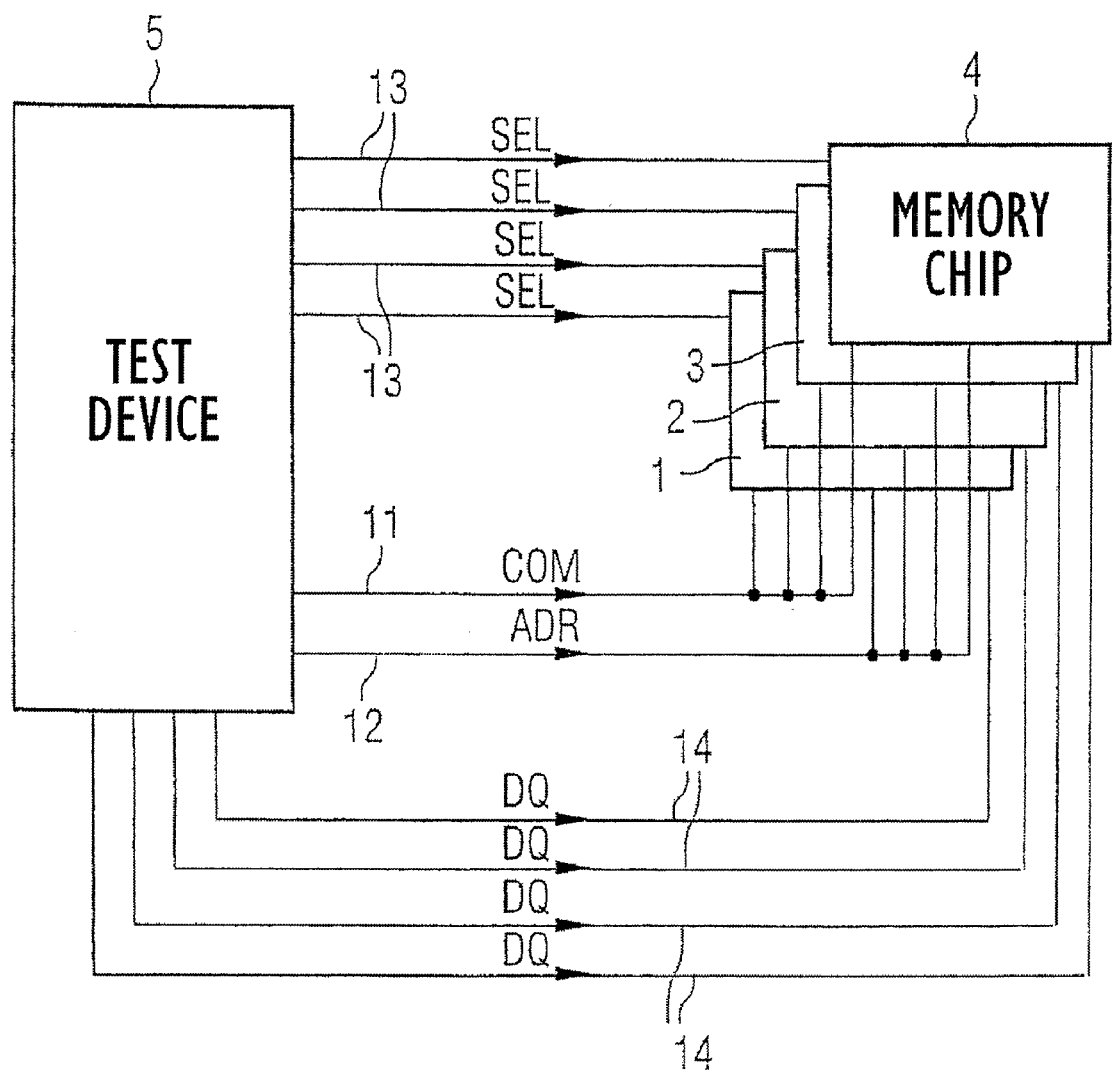

MEMORY MODULE WITH A TEST DEVICE

CROSS-REFERENCE TO RELATED APPLICATION

This application claims priority under 35 USC § 119 to German Application No. 10260184.4, filed on Dec. 20, 2002, and titled "Memory Module with a Test Device," the entire contents of which are hereby incorporated by reference.

FIELD OF THE INVENTION

The invention relates to a memory module with an electronic printed circuit board, a plurality of integrated memory chips arranged on the printed circuit board, and a test device with the aid of which it is possible to carry out an electrical functional test of at least one memory chip.

BACKGROUND

In a memory module, a test device is provided as a part of the memory chips which store information. The test unit is integrated on the respective memory chip and carries out an electrical functional test before the memory chip is mounted on the printed circuit board, in order to guarantee, before the actual mounting process, that the memory chip operates without any errors. During the functional test, which is carried out in each case internally within the memory chip, information is written to memory addresses and read from the latter, written and read information being compared with one another. A further functional test is carried out after the mounting of the memory chips on the printed circuit board, in which case the memory module is connected to an external tester. This tester is able to generate the test commands for testing the memory module, i.e., control commands, address commands, and data values to be stored, and the clock signal, which typically lies in the region of a few 100 MHz. With the aid of corresponding lines through which the memory module is connected to the external tester, the electrical functional test is then repeated in cross-memory-chip fashion, each memory chips usually being tested in parallel at the same time. This second functional test provides information about whether the electrical contact connections between the respective memory chips and the printed circuit board function satisfactorily.

External testers of this type have many parallel lines which are connected to the memory module and by which a large number of complex memory tests can be programmed. These connecting lines include data lines for each memory chip, corresponding control lines, which are generally simultaneously address lines, and also a clock line, which provides the required clock signal.

The connecting lines between the tester and the memory module are exposed to external ambient influences, i.e., electromagnetic fields, which can distort and corrupt the test signals in the MHz range. Moreover, the electrical contact connection of the memory module through many dozens of leads is complicated. On the other hand, a memory test downstream of the chip mounting process cannot conventionally be carried out differently, because only one external tester generates the test signal and the test commands, which simultaneously enable a functional test of all the memory chips of the memory module.

SUMMARY

A memory module can be tested by an electrical functional test in a more simple manner. In particular, a memory module design such that a cross-memory-chip functional test can be carried out without the outlay on apparatus that is conventionally required.

In such a memory module, the test device is arranged on the printed circuit board separately from the memory chips and is designed such that, in the event a clock signal is generated outside the memory module and fed in, the test device can generate control commands, address commands, and data values to be stored and forwards them to each memory chip of the plurality of memory chips.

Spatially separating generation of the clock signal required for carrying out an electrical functional test and generation of the test commands enables test functions to be partially integrated into the memory module simplifies the functional test. A conventional external tester performs both functions, and the tester is not completely integrated into the memory module due to space requirements for clock signal generation. According to the invention, a test unit is provided on the printed circuit board of the memory module. The test unit generates the test commands required for carrying out the functional test, in particular, control commands, address commands, and data values to be stored, but does not have its own clock generator and is therefore not functional by itself. However, in the event of the clock signal being fed in, the test unit can carry out the functional test autonomously and test the memory chips of the memory module in the process. The test device is connected to the memory chips to be tested, in particular, such that each chip can receive the generated test commands via corresponding lines, as a result of which a module-internal, cross-chip functional test can be carried out. In order to carry out the module-internal, cross-chip functional test, an external clock signal for test purposes and, if appropriate, a start signal to start the functional test of the test device, may be fed. These signals may continue to be provided by a conventional external tester which, however, is connected to the memory module by a small number of lines.

The memory module can have control lines and address lines for forwarding control commands and address commands, which connect the memory chips to the test device and which have nodes from which the control lines and address lines branch toward the memory chips of the plurality of memory chips. These control lines and address lines can enable a parallel test operation during which the memory chips of the memory module can be tested simultaneously. Leads issuing from different memory chips can be combined at the nodes and can transfer chip-independent control or address commands, in particular, memory-chip-internal address commands.

The memory module can have further lines, which connect an individual memory chip to the test device and by which the memory chips can be individually activated and deactivated in the event of a cross-memory-chip functional test. These further lines, which may be combined control/address lines, can enable, in conjunction with the branching lines, a selective test of individual memory chips, and the temporally successive testing of various memory chips on the memory module. In this case, although the tested memory chips can receive the same control and address commands, the functional test can occur in the activated memory chip. Testing the memory chips in temporal succession has the advantage that the test device can be made smaller, and thus, saves more space than in the case of a chip-parallel functional test.

The memory module can have data lines for forwarding data values, which can connect an individual memory chip to the test device. Although a majority of the control lines and address lines can be branching lines, which can drive the memory chips in parallel, the data lines can be connected to one memory chip (and to the test unit). As a result, a chip-specific read-out of test results is possible. The chip-specific data lines can also be used for activating and deactivating the memory chips.

The test device can be arranged in an integrated semiconductor chip arranged separately from the memory chips on the printed circuit board. In this case, the test device is not integrated into the printed circuit board, but rather is embodied as an integrated semiconductor circuit provided on or at the printed circuit board in a manner similar to the memory chips. It can be made significantly smaller than the memory chips to be tested.

The memory module can have an input terminal connected to the test device, through which a clock signal generated by an external clock generator can be fed to the test device. The input terminal can be connected to the test unit via conductor tracks of the printed circuit board, so that the test device itself does not require its own terminal.

The test device can have an evaluation unit, which evaluates in which of the memory chips the functional test has proceeded without any errors. This evaluation unit can provide a simple test result which, for example, can provide information about the position of a semiconductor chip connected with errors, or of a non-functioning contact to a memory chip. The evaluation of the write and read results need not be forwarded to an external tester, but rather can be effected directly on the memory module within the test device.

The memory module can have at least one output terminal through which a test result calculated by the evaluation unit can be fed to an external tester. The indication that the semiconductor chip or the contact to a semiconductor chip has an error can be effected by an external tester or indication device, so that the evaluation unit can output one or a plurality of electrical signals as test result. The dimensioning of the evaluation unit can be smaller as a result.

The input terminal for feeding in an external clock signal and the output terminal or output terminals for outputting a test result can be arranged in a contact strip of the memory module.

The memory chips of the memory module can be dynamic read-write memories, in particular, DRAMs.

BRIEF DESCRIPTION OF DRAWINGS

The invention is described below with reference to FIGS. 1 and 2, in which:

FIG. 2 is a schematic illustration of test signal lines between the test device and the memory chips of the memory module.

DETAILED DESCRIPTION

Figure 1:
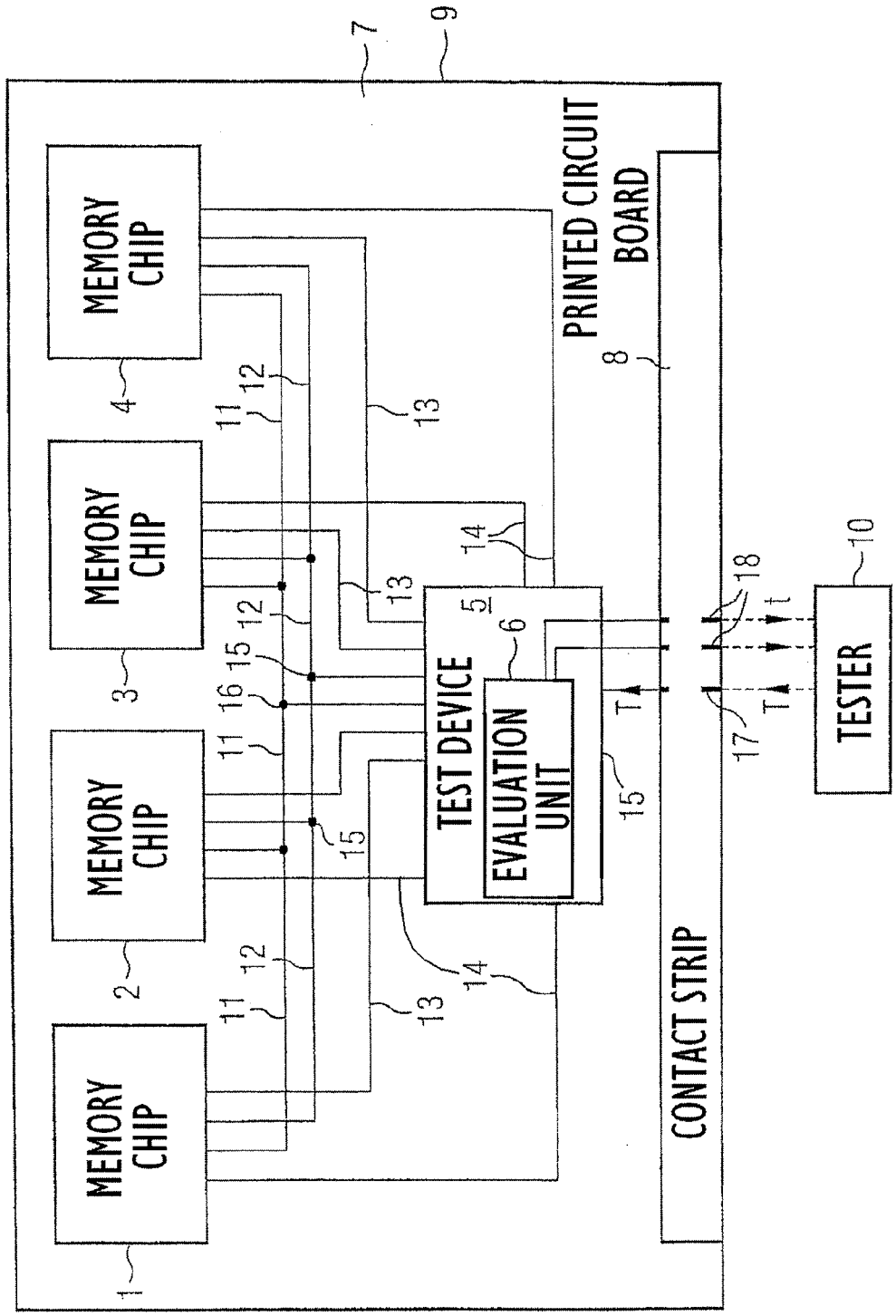
FIG. 1 illustrates a memory module with an external tester according to the invention.

FIG. 1 shows a memory module 9 with a printed circuit board 7, on which four memory chips 1, 2, 3, 4 can be arranged. These memory chips can have an on-chip test device which can be used to carry out a self-test of each chip (BIST; built-in self-test). These test devices are not illustrated pictorially in the four memory chips 1, 2, 3, 4. The test devices can carry out an on-chip test prior to the chip mounting process. A second memory test can be carried out, i.e., a cross-chip functional test. The second memory test can be carried out with the aid of an external tester 10, the functions of which can be partially integrated into the memory module 9. A test device 5 can be provided on the printed circuit board 7. The test device can receive a clock signal T from the external tester 10, but can generate the test commands if the clock signal T can be fed in. The memory chips 1, 2, 3, 4 can be connected to the test device 5 by combined control lines 11 and address lines 12. In addition, each memory chip 1, 2, 3, 4 can be connected to the test device 5 by data lines 14 and by further lines 13 for the selection of the individual memory chip. In this way, a central memory functional test of the memory chips can be carried out on the printed circuit board 7, even though the clock signal T required for carrying out the test is generated outside the memory module 9, namely in the external tester 10, and is fed from there. The structural separation of the test command generation in the test device 5 from the clock signal generation, which are conventional in the external tester, obviates the use of many leads between the tester 10 and the memory module 9. External interference influences on such lines can be reduced without overly increasing the complexity of the memory module 9 by the test device 5. The control lines 11 and the address lines 12 can have nodes 16 at which the lines branch to the memory chips. The lines 11 and 12 can communicate chip-independent control signals and chip-internal chip addresses. The memory chip to be tested can be selected by an activation or deactivation with the aid of corresponding further lines 13. The read results obtained via the data lines 14 can be communicated to the test unit 5 and can be processed in the evaluation unit 6 to form a test result, which can be communicated to the external tester 10 via output terminals 18. The communicated test result can be indicated by the external tester 10. An erroneously mounted memory chip can then be exchanged or reconnected at some or individual contacts.

FIG. 2 schematically shows the interconnection of the test device by connecting lines between the test device according to the invention and the memory chips 1, 2, 3, 4. Branching command lines 11 and address lines 12 are provided, of which only one line in each case is illustrated for the sake of simplicity. Each of these lines can connect to the memory chips 1, 2, 3, 4 and can transfer control commands COM and address commands ADR to the memory chips. The lines 11 and 12 can be unidirectional lines. Further lines 13 can serve for the selection, i.e., activation, of a respective chip 1, 2, 3, 4 with the aid of corresponding signals SEL. As a result, each memory chip can be driven individually in conjunction with the lines 11 and 12 and their commands COM and ADR, respectively. Data lines 14 can connect the memory chips 1, 2, 3, 4 individually to the test device 5. Data values DQ to be stored can be communicated to the memory chips via the lines 14. Corresponding data values can be communicated to the test device 5 via the data lines 14 during the read-out of the memory chips. The data values DQ are sequences of digital bit values 0; 1, which can be communicated in a bus of a plurality of parallel data lines 14 to the respective individual memory chip. For the sake of simplicity, only one data line 14 is illustrated for each memory chip in FIG. 2.

In the event of the clock frequency being provided externally by the tester 10, the test device 5 can generate the control commands, such as write, read, activate, and precharge. As a result, in particular, simple geometrical test patterns can be generated with regard to the arrangement of memory cells in the memory chips. By contrast, a device serving as clock generator and the power supply of the test device 5 can remain on the external tester itself. An indication unit can be arranged in the external tester 10, so that the test device 5 of the memory module 9 can have rudimentary functions with regard to test command generation and test command processing. The test device can be connected to the external tester 10 via a small number of lines 17, 18. Since test commands are no longer transported via these lines, the influence of external magnetic fields and the quality of the functional test can be reduced. The test device can be integrated as an additional circuit on the module board and may be arranged as a small, separate integrated semiconductor chip 15 on the printed circuit board 7. The test device 5 may be arranged, in particular, on an additional semiconductor chip 15, which can buffer a data stream between the semiconductor chips and an external hardware component, for example, further memory modules. The test device may be arranged, in particular, on a semiconductor chip, which effects a partial conversion from serial data transfer into parallel data transfer, and vice versa. In this case, no further additional semiconductor chip is required for the test device.

The test device 5 can enable a module-internal, cross-memory-chip self-test, i.e., a memory module BIST. With the aid of a connected external tester 10, the test commands can be generated and can be evaluated on the memory module 9. This module-internal self-test can supplement the on-chip self-test, which can be carried out on the memory chips 1, 2, 3, 4, which can be DRAMs (dynamic random access memories). DIMM memory modules, in particular, can benefit from this integration of additional test functions. The functional test according to the invention can be carried out at clock frequencies of between 100 and 600 MHz, preferably 200 MHz. Even at still higher frequencies, the integration leads to a greater independence with respect to external electromagnetic fields.

The details of one or more embodiments are set forth in the accompanying drawings and the description below. Other features will be apparent from the description and drawings and from the claims.

| List of Reference Symbols | |
|---|---|
| 1, 2, 3, 4 | Memory chip |
| 5 | Test device |
| 6 | Evaluation unit |
| 7 | Printed circuit board |
| 8 | Contact strips |
| 9 | Memory module |
| 10 | External tester |
| 11 | Control line |
| 12 | Address line |
| 13 | Further line |
| 14 | Data line |
| 15 | Semiconductor chip |
| 16 | Note |
| ADR | Address signal |
| COM | Control signal |
| DQ | Data value |
| SEL | Activation signal |
| T | Clock signal |
| t | Test result |

I claim:
1. A memory module, comprising:
an electronic printed circuit board;
a plurality of integrated memory chips arranged on the printed circuit board;
a test device arranged on the printed circuit board separately from the memory chips and configured to test the memory chips;
a control line for receiving control commands from the test device, the control line branching at a node into a plurality of control lines that respectively supply the control commands to the memory chips;
an address line for receiving address commands from the test device, the address line branching at a node into a plurality of address lines that respectively supply the address commands to the memory chips; and
a plurality of selections lines, each of the selection lines connecting an individual one of the memory chips to the test device, wherein the test device is configured to individually activate and deactivate memory chips for testing by supplying a selection signal to an individual memory chip on a respective selection line, such that the memory chips are individually selectable for testing via the selection lines;
wherein the test device, for testing the memory chips, autonomously generates the control commands, the address commands, and data values, without receiving any control command, address command, or data value from outside, in response to an external clock signal being supplied to the memory module, the test device supplying the control commands to the memory chips via the control lines and supplying the address commands to the memory chips via the address lines, the test device supplying the data values to the memory chips for storage in the memory chips during testing.

2. The memory module as claimed in claim 1, further comprising: a plurality of data lines for supplying the data values between the test device and the memory chips, each of the data lines connecting an individual one of the memory chips to the test device.

3. The memory module as claimed in claim 1, wherein the test device comprises an integrated semiconductor chip.

4. The memory module as claimed in claim 1, further comprising an input terminal configured to provide the external clock signal generated by an external clock generator to the test device.

5. The memory module as claimed in claim 1, wherein the test device comprises an evaluation unit configured to evaluate which of the memory chips performed successfully under test.

6. The memory module as claimed in claim 5, further comprising:
at least one output terminal configured to provide a test result calculated by the evaluation unit to an external tester.

7. The memory module as claimed in claim 6, wherein an input terminal and at least one output terminal are arranged in a contact strip of the memory module.

8. The memory module as claimed in claim 1, wherein the memory chips of the memory module are dynamic read-write memories.

* * * * *